United States Patent
Koizumi et al.

(10) Patent No.: US 7,576,477 B2
(45) Date of Patent: Aug. 18, 2009

(54) PIEZOELECTRIC/ELECTROSTRICTIVE PORCELAIN COMPOSITION AND METHOD OF MANUFACTURING THE SAME

(75) Inventors: Takaaki Koizumi, Nagoya (JP);
Hirofumi Yamaguchi, Komaki (JP);
Ritsu Tanaka, Nagoya (JP)

(73) Assignee: NGK Insulators, Ltd., Nagoya-Shi (JP)

( * ) Notice: Subject to any disclaimer, the term of this patent is extended or adjusted under 35 U.S.C. 154(b) by 338 days.

(21) Appl. No.: 11/370,213

(22) Filed: Mar. 7, 2006

(65) Prior Publication Data

US 2006/0202170 A1     Sep. 14, 2006

Related U.S. Application Data

(60) Provisional application No. 60/659,484, filed on Mar. 8, 2005.

(51) Int. Cl.
*H01L 41/187* (2006.01)
*H01L 41/18* (2006.01)
*C04B 35/495* (2006.01)

(52) U.S. Cl. .................. 310/365; 252/62.9 R; 501/134
(58) Field of Classification Search ............. 252/62.9 R
See application file for complete search history.

(56) References Cited

U.S. PATENT DOCUMENTS

| 6,049,158 | A | 4/2000 | Takeuchi et al. |
| 6,531,070 | B1 * | 3/2003 | Yamaguchi et al. ...... 252/62.9 R |
| 7,101,491 | B2 * | 9/2006 | Nonoyama et al. ...... 252/62.9 R |
| 2004/0058797 | A1 | 3/2004 | Nonoyama et al. |
| 2004/0214723 | A1 | 10/2004 | Nonoyama et al. |

FOREIGN PATENT DOCUMENTS

| CN | 1129359 A1 | 8/1996 |
| JP | S44-17103 | 7/1969 |
| JP | S45-8145 | 3/1970 |
| JP | 2003-221276 | 8/2003 |
| JP | 2003-300776 | 10/2003 |
| JP | 2004-244300 | 9/2004 |
| JP | 2004-300019 | 10/2004 |

* cited by examiner

*Primary Examiner*—Melvin C Mayes
*Assistant Examiner*—James Corno
(74) *Attorney, Agent, or Firm*—Burr & Brown

(57) ABSTRACT

A piezoelectric/electrostrictive porcelain composition is provided, including at least Nb, Ta, and one or more alkali metal elements, wherein a molar ratio of the Nb, Ta, and alkali metal element is represented by a non-stoichiometric composition ratio.

3 Claims, 2 Drawing Sheets

PIEZOELECTRIC/ELECTROSTRICTIVE PORCELAIN COMPOSITION AND METHOD OF MANUFACTURING THE SAME

BACKGROUND OF THE INVENTION

The present invention relates to a piezoelectric/electrostrictive porcelain composition, and a method of manufacturing the composition, more particularly to a piezoelectric/electrostrictive porcelain composition capable of obtaining a piezoelectric/electrostrictive device which is dense and which is superior in crystallinity and which exhibits superior piezoelectric/electrostrictive characteristics, a method of manufacturing the composition, and a piezoelectric/electrostrictive device having superior piezoelectric/electrostrictive characteristics.

BACKGROUND ART

Heretofore, a piezoelectric/electrostrictive device has been known as a device capable of controlling micro displacement of the order of sub-microns. Especially, a piezoelectric/electrostrictive device is suitable for the control of the micro displacement. In the device, a piezoelectric/electrostrictive article (a piezoelectric/electrostrictive portion) constituted of a piezoelectric/electrostrictive porcelain composition and an electrode portion to which a voltage is applied are layered on a substrate made of a ceramic. Additionally, the device has superior characteristics such as a high electromechanical conversion efficiency, a high-speed response, a high durability, and a saved power consumption. The piezoelectric/electrostrictive device is used in various applications such as a piezoelectric pressure sensor, a probe moving mechanism of a scanning type tunnel microscope, a rectilinear guide mechanism in an ultra-precise working device, a servo valve for hydraulic control, a head of a VTR device, a pixel constituting a flat panel type image display device, and a head of an ink jet printer.

Moreover, the piezoelectric/electrostrictive porcelain composition constituting the piezoelectric/electrostrictive article is also variously investigated. For example, there have been disclosed a $Pb(Mg_{1/3}Nb_{2/3})O_3$—$PbTiO_3$—$PbZrO_3$ three-components dissolved composition, and a piezoelectric/electrostrictive porcelain composition in which a part of Pb in the composition is replaced with Sr, La or the like (see, e.g., Patent Documents 1 and 2). As to the piezoelectric/electrostrictive article itself which is the most important portion that determines a piezoelectric/electrostrictive characteristic of the piezoelectric/electrostrictive device, there is expected to be obtained the piezoelectric/electrostrictive device having a superior piezoelectric/electrostrictive characteristic (e.g., piezoelectric d constant).

However, the PZT-based composition unavoidably contains lead (Pb). Especially, in recent years, an influence on global environments, such as elution of lead (Pb) due to acid rain, has tended to be regarded as a problem. As a piezoelectric/electrostrictive material in which such influence on the environments is considered, there is disclosed a $BaTiO_3$-based piezoelectric/electrostrictive porcelain composition capable of providing a piezoelectric article or a piezoelectric device which exhibits the satisfactory piezoelectric/electrostrictive characteristic although lead (Pb) is not contained. However, there is a problem that Curie point of the $BaTiO_3$-based piezoelectric/electrostrictive porcelain composition is as low as about 120° C., and the composition is not suitable for use on high-temperature conditions.

Moreover, there is developed an $(LiNaK)(NbTa)O_3$-based piezoelectric/electrostrictive porcelain composition as a non-lead piezoelectric/electrostrictive material in which the influences on the environments are similarly considered. The composition has Curie point which is higher than that of the $BaTiO_3$-based piezoelectric/electrostrictive porcelain composition (see, e.g., Patent Document 3).

However, in many of general piezoelectric/electrostrictive porcelain compositions including the $(LiNaK)(NbTa)O_3$-based piezoelectric/electrostrictive porcelain composition, a firing temperature needs to be raised in order to promote crystal grain growth. Therefore, a manufacturing cost respect needs to be improved more. In the piezoelectric/electrostrictive device obtained using the $(LiNaK)(NbTa)O_3$-based piezoelectric/electrostrictive porcelain composition or the like, it is difficult to obtain a large displacement as compared with the piezoelectric/electrostrictive device obtained using the PZT-based composition containing lead (Pb). It has to be said that the PZT-based composition is superior in piezoelectric/electrostrictive characteristic in the present situations. Therefore, there has been a necessity of developing a piezoelectric/electrostrictive porcelain composition capable of providing a device which exhibits the superior piezoelectric/electrostrictive characteristic even in a case where any lead (Pb) is not contained.

| [Patent Document 1] | JP-B-44-17103 |
| [Patent Document 2] | JP-B-45-8145 |
| [Patent Document 3] | JP-A2003-221276 |

SUMMARY OF THE INVENTION

The present invention has been developed in view of such problems present in the conventional technology, and an object thereof is to provide a piezoelectric/electrostrictive porcelain composition capable of obtaining a piezoelectric/electrostrictive device which is dense and which is superior in crystallinity and which exhibits superior piezoelectric/electrostrictive characteristics even in a case where the composition is fired on lower-temperature conditions as compared with the conventional technology and to provide a method of manufacturing the composition and a piezoelectric/electrostrictive device having superior piezoelectric/electrostrictive characteristics.

As a result of intensive investigations to achieve the above-described object by the present inventors, it has been found that when compounds containing Nb, Ta, and an alkali metal element, respectively are mixed in such a manner as to obtain a non-stoichiometric composition ratio of Nb, Ta, and the alkali metal element, the above-described object can be achieved, and the present invention has been completed.

That is, according to the present invention, there are provided the following piezoelectric/electrostrictive porcelain composition, method of manufacturing the composition, and piezoelectric/electrostrictive device.

According to a first aspect of the present invention, a piezoelectric/electrostrictive porcelain composition is provided, including at least Nb, Ta, and one or more alkali metal elements, wherein a molar ratio of Nb, Ta, and the alkali metal element is represented by a non-stoichiometric composition ratio.

According to a second aspect of the present invention, the piezoelectric/electrostrictive porcelain composition according to the first aspect is provided, which is obtained by mixing compounds including metal elements in a composition represented by the following general formula (1) in such a manner as to satisfy a ratio (molar ratio) of the metal elements in the composition, thereby obtaining a mixture, and then calcining the resultant mixture:

$$A_1(Nb_xTa_y)O_{3-\delta} \quad (1);$$

wherein A denotes at least one alkali metal element selected from the group consisting of Li, Na and K, and $0.7 \leq (x+y) < 1.0$.

According to a third aspect of the present invention, the piezoelectric/electrostrictive porcelain composition according to the second aspect is provided, wherein a range of x+y is $0.7 \leq (x+y) \leq 0.995$ in the general formula (1).

According to a fourth aspect of the present invention, the piezoelectric/electrostrictive porcelain composition according to the first or second aspects is provided, wherein A in the general formula (1) is represented by the following general formula (2), and ranges of x and y are $0<x<1$ and $0<y<1$, respectively:

$$Li_aNa_bK_c \quad (2);$$

wherein $0<a \leq 0.5, 0 \leq b \leq 1$, and $0 \leq c \leq 1$.

According to a fifth aspect of the present invention, the piezoelectric/electrostrictive porcelain composition according to the first aspect is provided, which further contains Sb and is obtained by mixing compounds including metal elements in a composition represented by the following general formula (3) in such a manner as to satisfy a ratio (molar ratio) of the metal elements in the composition, thereby obtaining a mixture, and then calcining the resultant mixture:

$$A_1(Nb_xTa_ySb_z)O_{3-\delta} \quad (3);$$

wherein A denotes at least one alkali metal element selected from the group consisting of Li, Na and K, and $0.7 \leq (x+y) < 1.0$ and $0<z<1$.

According to a sixth aspect of the present invention, the method of manufacturing a piezoelectric/electrostrictive porcelain composition is provided, comprising the steps of mixing compounds including metal elements in a composition represented by the following general formula (1) in such a manner as to satisfy a ratio (molar ratio) of the metal elements in the composition, thereby obtaining a mixture; and calcining the resultant mixture to thereby obtain the piezoelectric/electrostrictive porcelain composition containing Nb, Ta, and one or more alkali metal elements, a molar ratio of Nb, Ta, and the alkali metal element being represented by a non-stoichiometric composition ratio:

$$A_1(Nb_xTa_y)O_{3-\delta} \quad (1);$$

wherein A denotes at least one alkali metal element selected from the group consisting of Li, Na and K, and $0.7 \leq (x+y) < 1.0$.

According to a seventh aspect of the present invention, the method of manufacturing the piezoelectric/electrostrictive porcelain composition according to the sixth aspect is provided, wherein A in the general formula (1) is represented by the following general formula (2), and ranges of x and y are $0<x<1$ and $0<y<1$, respectively:

$$Li_aNa_bK_c \quad (2);$$

Wherein $0<a \leq 0.5, 0 \leq b \leq 1$, and $0 \leq c \leq 1$.

According to an eighth aspect of the present invention, a piezoelectric/electrostrictive device is provided, comprising a piezoelectric/electrostrictive article obtained by firing the piezoelectric/electrostrictive porcelain composition according to any one of the first through fifth aspects; and an electrode electrically connected to the piezoelectric/electrostrictive article.

According to a ninth aspect of the present invention, the piezoelectric/electrostrictive device according to the eighth aspect is provided, wherein the piezoelectric/electrostrictive article and the electrode have film-like shapes, respectively, and which further comprises a substrate made of a ceramic, and the piezoelectric/electrostrictive article being secured to the substrate directly or via the electrode.

The piezoelectric/electrostrictive porcelain composition of the present invention produces effects that it is possible to obtain the piezoelectric/electrostrictive device which is dense and superior in crystallinity even in a case where the composition is fired on lower-temperature conditions as compared with the conventional technology and which exhibits superior piezoelectric/electrostrictive characteristics.

According to the method of manufacturing the piezoelectric/electrostrictive porcelain composition of the present invention, the piezoelectric/electrostrictive porcelain composition can be manufactured by firing the composition on lower-temperature conditions as compared with the conventional technology, so that it is possible to obtain the piezoelectric/electrostrictive device which is dense and which is superior in crystallinity and which exhibits superior piezoelectric/electrostrictive characteristics.

Moreover, the present invention produces an effect that the piezoelectric/electrostrictive device has superior piezoelectric/electrostrictive characteristics.

Figure 1:
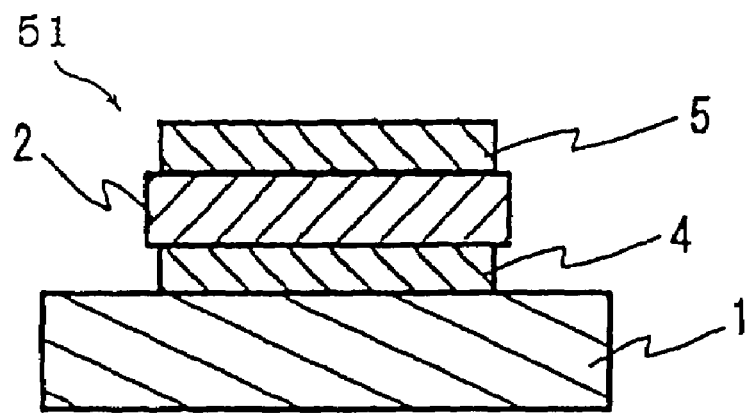
FIG. 1 is a sectional view schematically showing one embodiment of a piezoelectric/electrostrictive device of the present invention.

Description of the Reference Numerals Used in the Accompanying Drawings

1a: secured surface;
1b: thick portion;
1c: thin portion;
1: substrate;
2, 3: piezoelectric/electrostrictive article;
4, 5, 6: electrode;
10: piezoelectric/electrostrictive device unit;
12: first piezoelectric/electrostrictive article;
13: second piezoelectric/electrostrictive article;
20: common substrate;- and
51: piezoelectric/electrostrictive device.

DETAILED DESCRIPTION OF THE INVENTION

The best mode for carrying out the present invention will be described hereinafter, but it should be understood that the present invention is not limited to the following embodiments, and the present invention includes appropriate alterations, modifications and the like added to the following embodiments based on ordinary knowledge of a person skilled in the art without departing from the scope of the present invention.

One embodiment of a piezoelectric/electrostrictive porcelain composition of the present invention is a piezoelectric/electrostrictive porcelain composition containing at least Nb, Ta, and one or more kinds of alkali metal elements, and a ratio (molar ratio) of Nb, Ta, and the alkali metal element is represented by a non-stoichiometric composition ratio. Details will be described hereinafter.

The piezoelectric/electrostrictive porcelain composition of the present embodiment contains at least Nb, Ta, and one or more kinds of alkali metal elements. It is to be noted that the piezoelectric/electrostrictive porcelain composition of the present embodiment is preferably essentially constituted of Nb, Ta, and one or more kinds of alkali metal elements. Typical examples of the alkali metal element include Li, Na, and K. The ratio (molar ratio) of Nb, Ta, and the alkali metal element constituting the piezoelectric/electrostrictive porcelain composition of the present embodiment is represented by the non-stoichiometric composition ratio. Here, "represented by the non-stoichiometric composition ratio" indicates that a ratio of the respective elements constituting the piezoelectric/electrostrictive porcelain composition is not represented by a simple integer ratio. To be more specific, the ratio (molar ratio) of a transition metal element group including Nb and Ta constituting a B site is not represented by an integer with respect to an alkali metal element (group) 1 constituting an A site of a perovskite.

Since the ratio (molar ratio) of Nb, Ta, and the alkali metal element is represented by the non-stoichiometric composition ratio in this manner in the piezoelectric/electrostrictive porcelain composition of the present embodiment, it is possible to obtain a piezoelectric/electrostrictive device which is dense and superior in crystallinity even in a case where the composition is fired on lower-temperature conditions as compared with a conventional technology and which exhibits superior piezoelectric/electrostrictive characteristics. The following reasons are presumed for such produced effects.

For example, it is presumed that when the metal elements of the A site constituting the perovskite structure are excessive, surface energy due to defects increases, and a driving force increases. Accordingly, grain growth is facilitated, and a firing temperature can be lowered. It is presumed that since automorphism is easily generated in the fired surface in the conventional piezoelectric/electrostrictive porcelain composition represented by a stoichiometric composition ratio, densification of the fired surface is not easily promoted. On the other hand, it is supposed that in the piezoelectric/electrostrictive porcelain composition represented by the non-stoichiometric composition ratio, since distortion is included in lattices, the automorphism is not easily generated in the fired surface, and the densification of the fired surface is promoted.

It is generally known that electric field induced distortion, which is one of characteristics required for a piezoelectric/electrostrictive materials, is generated when domain rotates in an electric-field direction at the time of application of an electric field. It is supposed that the direction of spontaneous polarization is maintained even when the electric field is removed in the conventional piezoelectric/electrostrictive porcelain composition represented by the stoichiometric composition ratio. On the other hand, it is supposed that a part of the domain returns due to the spontaneous polarization generated by the defects, when the electric field is removed in the piezoelectric/electrostrictive porcelain composition represented by the non-stoichiometric composition ratio according to the present embodiment. This is supposedly because the defects present in the lattices exist symmetrically with the spontaneous polarization of a ferroelectric phase, and another spontaneous polarization is generated in the same direction as that of the spontaneous polarization. That is, the domain rotates reversibly by the application of the electric field in the piezoelectric/electrostrictive porcelain composition of the present embodiment. Therefore, in the piezoelectric/electrostrictive porcelain composition of the present embodiment, electric field induced distortion increases as compared with the conventional piezoelectric/electrostrictive porcelain composition in which the distortion is generated by the only dipole displacement and which is represented by the stoichiometric composition ratio.

Additionally, in Japanese Patent No. 3531803, there is disclosed an alkali-metal-containing niobium-oxide-based piezoelectric material composition constituted of a solid solution whose composition is represented by $Li_x(K_{1-y}Na_y)_{1-x}(Nb_{1-z}Ta_z)O_3$. However, this piezoelectric material composition is represented by the stoichiometric composition ratio, and it is not disclosed or suggested that the composition is the non-stoichiometric ratio. Effects and the like are not disclosed or suggested. Therefore, this constitution is apparently different from that of the piezoelectric/electrostrictive porcelain composition of the present invention which is represented by the non-stoichiometric composition ratio.

To manufacture the piezoelectric/electrostrictive porcelain composition of the present embodiment, first, compounds containing Nb, Ta, and the alkali metal element, respectively are mixed to obtain a mixture. To obtain this mixture, the compounds containing the metal elements, respectively, are preferably mixed in such a manner as to satisfy the ratio (molar ratio) of each metal element in the composition represented by the following general formula (1). It is to be noted that there is not any restriction on types of compounds containing the metal elements, respectively, but an oxide of each metal element, carbonate or the like is preferably used.

$$A_1(Nb_xTa_y)O_{3-\delta} \qquad (1),$$

wherein A denotes at least one alkali metal element selected from the group consisting of Li, Na, and K, and $0.7 \leq (x+y) < 1.0$.

When the resultant mixture is calcined, it is possible to obtain the piezoelectric/electrostrictive porcelain composition of the present embodiment in which the ratio (molar ratio) of each metal element constituting the mixture is represented by the non-stoichiometric composition ratio. When a value of "x+y" is less than 0.7, there is such a tendency that the excessive alkali metal element is not completely dissolved to form another compound, or the element is precipitated as carbonate or the like to lower insulating resistance. On the other hand, when the value of "x+y" is 1.0 or more, sinterability degrades, the automorphism is generated, and a densified degree of the fired surface tends to drop easily. It is to be noted that the value of "x+y" is in a range of preferably $0.7 \leq (x+y) \leq 0.995$, more preferably $0.90 \leq (x+y) \leq 0.99$, the most preferably $0.95 \leq (x+y) \leq 0.99$.

In the piezoelectric/electrostrictive porcelain composition of the present embodiment, in the general formula (1), A is represented by the following general formula (2), and ranges of x and y are preferably $0<x<1$, $0<y<1$, more preferably $0.5 \leq x \leq 0.95$, $0.05 \leq y \leq 0.5$:

$$Li_aNa_bK_c \qquad (2),$$

wherein $0<a \leq 0.5$, $0 \leq b \leq 1$, $0 \leq c \leq 1$.

It is to be noted that transition metal elements other than Nb and Ta may be contained in the B site (site containing Nb and Ta as the constituting metal elements) in the general formula (1). Examples of the transition metal element other than Nb and Ta include V, W, Cu, Ni, Co, Fe, Mn, Cr, Ti, Zr, Mo, and Zn.

In addition, it is preferable that the piezoelectric/electrostrictive porcelain composition of the present embodiment further contains Sb in order to obtain a piezoelectric/electrostrictive device showing more excellent piezoelectric/electrostrictive properties because a large amount of electrostriction is generated. To obtain a piezoelectric/electrostrictive porcelain composition further containing Sb, for example, compounds containing the metal elements are mixed together to obtain a mixture in such a manner that the ratio (molar ratio) of the metal compounds in the composition shown by the following general formula (3) is satisfied, and the mixture is calcined to give a piezoelectric/electrostrictive porcelain composition further containing Sb of the present embodiment.

$$A_1(Nb_xTa_ySb_z)O_{3-\delta} \quad (3),$$

wherein A denotes at least one alkali metal element selected from the group consisting of Li, Na and K, and $0.7 \leq (x+y) < 1.0$ and $0 < z < 1$.

Next, an embodiment of the piezoelectric/electrostrictive device of the present invention will be described. The piezoelectric/electrostrictive device of the present embodiment is constituted of: a piezoelectric/electrostrictive article obtained by firing any of the piezoelectric/electrostrictive porcelain compositions according to the embodiment of the present invention; and an electrode electrically connected to this piezoelectric/electrostrictive article. That is, the piezoelectric/electrostrictive device of the present embodiment is constituted of: a piezoelectric/electrostrictive article obtained by firing a piezoelectric/electrostrictive porcelain composition which contains at least Nb, Ta, and one or more alkali metal elements and in which a ratio (molar ratio) of Nb, Ta, and the alkali metal element is represented by a non-stoichiometric composition ratio; and an electrode electrically connected to this piezoelectric/electrostrictive article.

As described above, according to the embodiment of the present invention, in the piezoelectric/electrostrictive porcelain composition, the ratio (molar ratio) of Nb, Ta, and the alkali metal element is represented by the non-stoichiometric composition ratio. Therefore, the piezoelectric/electrostrictive article constituted by firing this piezoelectric/electrostrictive porcelain composition is dense and superior in crystallinity, and has satisfactory piezoelectric/electrostrictive characteristics. Furthermore, the article is obtained at a comparatively low firing temperature. Therefore, in the piezoelectric/electrostrictive device of the present embodiment, an Ag—Pd electrode having a melting point lower than that of a Pt electrode can be positively used. The device is also superior in energy cost and versatility.

In the piezoelectric/electrostrictive device of the present embodiment, an average particle diameter of crystal particles constituting the piezoelectric/electrostrictive article is in a range of preferably 0.1 to 10 μm, more preferably 0.2 to 8.5 μm, especially preferably 0.3 to 7 μm. When an average particle diameter is less than 0.1 μm, a domain is not sufficiently developed in the piezoelectric/electrostrictive article in some case. Therefore, the piezoelectric/electrostrictive characteristics sometimes degrade. On the other hand, when the average particle diameter exceeds 10 μm, the domain in the piezoelectric/electrostrictive article sufficiently develops. On the other hand, the domain does not easily move, and the piezoelectric/electrostrictive characteristics are reduced in some cases. It is to be noted that the piezoelectric/electrostrictive article and the electrode constituting the piezoelectric/electrostrictive device of the present embodiment can be formed into various shapes. Typical examples of the piezoelectric/electrostrictive article include a block-like shape (so-called bulk article) and a sheet-like shape (film-like shape).

Next, the embodiment of the piezoelectric/electrostrictive device of the present invention will be described specifically with reference to the drawings. FIG. 1 is a sectional view schematically showing one embodiment of the piezoelectric/electrostrictive device according to the present invention. As shown in FIG. 1, in the present embodiment, a piezoelectric/electrostrictive device 51 includes a substrate 1 made of a ceramic, a film-like piezoelectric/electrostrictive article 2, and film-like electrodes 4, 5 electrically connected to the piezoelectric/electrostrictive article 2. The piezoelectric/electrostrictive article 2 is fixed onto the substrate 1 via the electrode 4. It is to be noted that the piezoelectric/electrostrictive article may be directly secured to the substrate without disposing any electrode. It is to be noted that in the present specification, "secured" indicates a state in which the piezoelectric/electrostrictive article 2 and the substrate 1 or the electrode 4 are closely formed integrally with each other without using any organic or inorganic adhesive.

In the present embodiment, the piezoelectric/electrostrictive article 2 of the piezoelectric/electrostrictive device 51 is constituted by firing any of the piezoelectric/electrostrictive porcelain compositions according to the embodiment of the present invention. That is, in the present embodiment, the piezoelectric/electrostrictive article 2 of the piezoelectric/electrostrictive device 51 is constituted by firing the piezoelectric/electrostrictive porcelain composition which contains at least Nb, Ta, and one or more alkali metal elements and in which the ratio (molar ratio) of Nb, Ta, and the alkali metal element is represented by the non-stoichiometric composition ratio.

As described above, in the piezoelectric/electrostrictive porcelain composition according to the embodiment of the present invention, the ratio (molar ratio) of Nb, Ta, and the alkali metal element is represented by the non-stoichiometric composition ratio. Therefore, the piezoelectric/electrostrictive article 2 formed by firing this piezoelectric/electrostrictive porcelain composition is dense and superior in crystallinity. Therefore, in the present embodiment, the piezoelectric/electrostrictive device 51 provided with this piezoelectric/electrostrictive article 2 has satisfactory piezoelectric/electrostrictive characteristics, and can obtain large displacement. Furthermore, the piezoelectric/electrostrictive article 2 can be formed at a comparatively low firing temperature. Therefore, the Ag—Pd electrode having a melting point lower than that of the Pt electrode can be positively used, and the device is also superior in energy cost and versatility.

Figure 3:
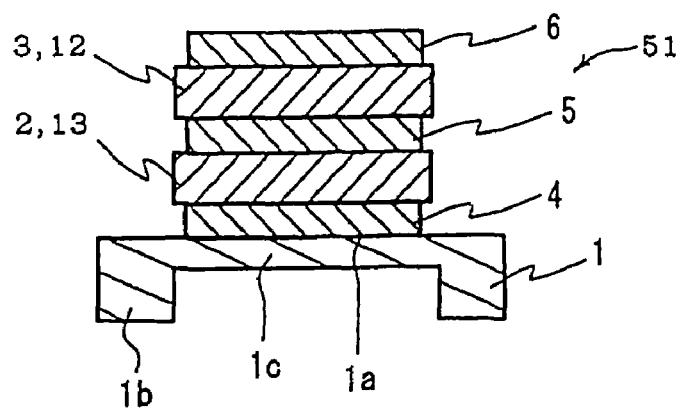
FIG. 3 is a sectional view schematically showing still another embodiment of the piezoelectric/electrostrictive device of the present invention.

Moreover, as shown in FIG. 3, the piezoelectric/electrostrictive device 51 of the present embodiment may include: a plurality of piezoelectric/electrostrictive articles 2, 3; an a plurality of electrodes 4, 5, and 6, and the plurality of piezoelectric/electrostrictive articles 2, 3 are preferably alternately sandwiched and layered between the plurality of electrodes 4, 5, and 6. This constitution is a so-called multilayered constitution, and a large flexural displacement can be preferably obtained at a low voltage.

In the piezoelectric/electrostrictive device 51 (see FIG. 1) of the present embodiment, a thickness of the piezoelectric/electrostrictive article 2 is in a range of preferably 0.5 to 50 μm, more preferably 0.8 to 40 μm, especially preferably 1.0 to 30 μm. In the case where the thickness of the piezoelectric/electrostrictive article 2 is less than 0.5 μm, according to the embodiment of the present invention, even the piezoelectric/electrostrictive article constituted of the piezoelectric/electrostrictive porcelain composition is insufficiently densified in some case. On the other hand, when the thickness of the piezoelectric/electrostrictive article 2 exceeds 50 μm, the compressive stress of the piezoelectric/electrostrictive porcelain composition at the time of firing increases. In order to prevent the substrate 1 from being destroyed, a thicker substrate 1 is required, and it is sometimes difficult to handle miniaturization of the device. It is to be noted that as shown in FIG. 3, the thicknesses of the piezoelectric/electrostrictive articles 2, 3 in a case where the piezoelectric/electrostrictive device 51 has a so-called multilayered constitution refer to those of the piezoelectric/electrostrictive articles 2, 3, respectively.

In the embodiment of the present invention, the substrate constituting the piezoelectric/electrostrictive device is made of a ceramic, but there is not any special restriction on a type of ceramic. However, with respect to heat resistance, chemical stability, and insulating property, the ceramic preferably contains at least one selected from the group consisting of stabilized zirconium oxide, aluminum oxide, magnesium oxide, mullite, aluminum nitride, silicon nitride, and glass. Above all, stabilized zirconium oxide is more preferable from a viewpoint that its mechanical strength is large and its toughness is superior. It is to be noted that "stabilized zirconium oxide" mentioned in the present specification refers to zirconium oxide in which phase transition of crystals is inhibited by addition of a stabilizer, and includes partially stabilized zirconium oxide in addition to stabilized zirconium oxide.

Examples of stabilized zirconium oxide include zirconium oxide containing as the stabilizer 1 to 30 mol % of calcium oxide, magnesium oxide, yttrium oxide, scandium oxide, ytterbium oxide, cerium oxide, or oxide of a rare earth metal. Above all, zirconium oxide containing yttrium oxide as the stabilizer is preferable because the mechanical strength of a vibrating portion is especially high. In this case, zirconium oxide contains preferably 1.5 to 6 mol %, more preferably 2 to 4 mol % of yttrium oxide. Zirconium oxide more preferably contains 0.1 to 5 mol % of aluminum oxide. A crystal phase of stabilized zirconium oxide may be a mixed phase of a cubic system+a monoclinic system, a mixed phase of a tetragonal system+the monoclinic system, a mixed phase of the cubic system+the tetragonal system+the monoclinic system or the like. However, when a main crystal phase is the tetragonal system, or the mixed phase of the tetragonal system+the cubic system, the phase is preferable from viewpoints of strength, toughness, and durability.

It is to be noted that the thickness of the substrate is in a range of preferably 1 μm to 1 mm, more preferably 1.5 to 500 μm, especially preferably 2 to 200 μm. When the thickness of the substrate is less than 1 μm, the mechanical strength of the piezoelectric/electrostrictive device sometimes drops. On the other hand, in a case where the thickness exceeds 1 mm, when a voltage is applied to the piezoelectric/electrostrictive article. rigidity of the substrate against the generated compressive stress increases, and the flexural displacement of the piezoelectric/electrostrictive article is sometimes reduced.

Figure 2:
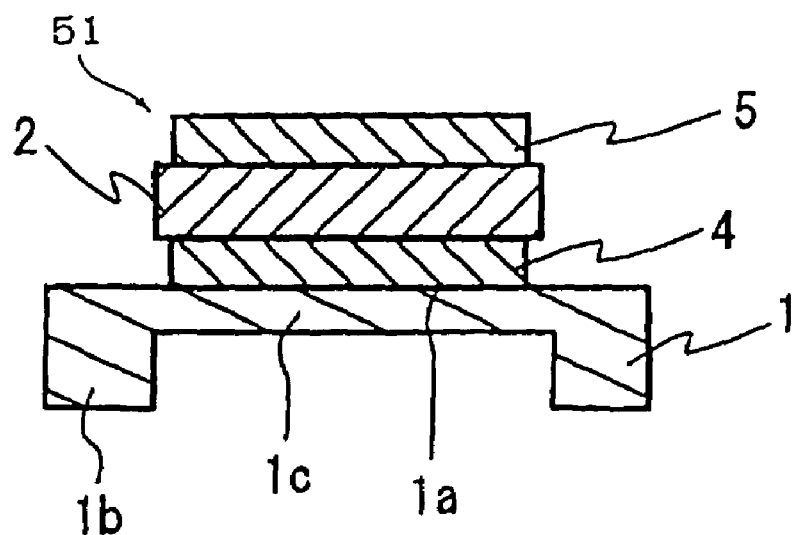
FIG. 2 is a sectional view schematically showing another embodiment of the piezoelectric/electrostrictive device of the present invention.
Figure 4:
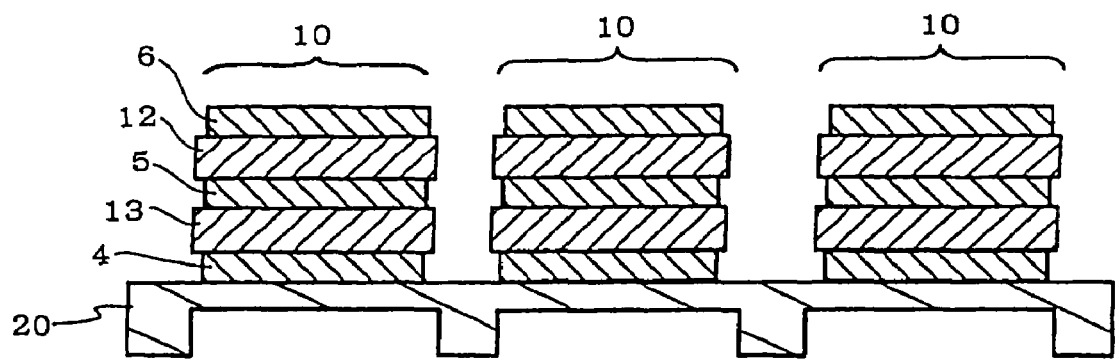
FIG. 4 is a sectional view schematically showing a further embodiment of the piezoelectric/electrostrictive device of the present invention.

However, as shown in FIG. 2, a shape of the substrate 1 may be provided with: a thin portion 1c on whose one surface a secured surface 1a is formed and which has the above-described thickness; and a thick portion 1b disposed on a portion other than a portion corresponding to this secured surface 1a and which has a thickness larger than that of the thin portion 1c. It is to be noted that the electrode 4 (or the piezoelectric/electrostrictive article) is disposed in a region substantially corresponding to the secured surface 1a. When the substrate 1 has such shape, a piezoelectric/electrostrictive device can be constituted which has a sufficiently large flexural displacement and whose mechanical strength is large. As shown in FIG. 4, a common substrate 20 may be used which is continuously provided with the shapes of the substrates 1 shown in FIG. 2. A plurality of piezoelectric/electrostrictive device units 10 each including first piezoelectric/electrostrictive article 12, a second piezoelectric/electrostrictive article 13, and the electrodes 4, 5, and 6 may be disposed on the common substrate 20.

There is not any special restriction on a surface shape (shape of the surface to which the electrode 4 is secured in FIG. 1) of the substrate in the piezoelectric/electrostrictive device according to the embodiment of the present invention. Examples of the surface shape include a rectangular shape, a square shape, a triangular shape, an elliptic shape, a circular shape, a round chamfered square shape, a round chamfered rectangular shape, and a composite shape of a combination of these shapes. There is not any special restriction on the whole shape of the substrate, and the substrate may have a capsule shape having an appropriate internal space.

In the piezoelectric/electrostrictive device of the present embodiment, the electrode is electrically connected to the piezoelectric/electrostrictive article, and preferably disposed between the respective piezoelectric/electrostrictive articles. The electrode is preferably disposed on the piezoelectric/electrostrictive article including a region which substantially contributes to the flexural displacement or the like. For example, as shown in FIG. 3, the electrodes 4, 5, and 6 are preferably disposed in a region of 80% or more by area including the vicinity of the center of the surface on which the first and second piezoelectric/electrostrictive articles 12 and 13 are formed.

In the piezoelectric/electrostrictive device of the present embodiment, examples of a material of the electrode include at least one kind of metal selected from the group of Pt, Pd, Rh, Au, Ag, and an alloy of them. Above all, platinum or an alloy containing platinum as a main component is preferable in that heat resistance in firing the piezoelectric/electrostrictive article is high. Since the piezoelectric/electrostrictive article can be formed at a lower firing temperature, an Ag—Pd alloy or the like can be preferably used.

In the piezoelectric/electrostrictive device of the present embodiment, the thickness of the electrode is preferably 15 μm or less, more preferably 5 μm or less. When the thickness exceeds 15 μm, the electrode functions as a relaxing layer, and the flexural displacement sometimes decreases. It is to be noted that the thickness of the electrode may be 0.05 μm or more from a viewpoint that the function as a substantial electrode be exerted.

Next, there will be described one embodiment of a method of manufacturing the piezoelectric/electrostrictive porcelain composition of the present invention. To manufacture the piezoelectric/electrostrictive porcelain composition of the present embodiment, first, a compound of each metal element, for example, an oxide or carbonate, is weighed so as to satisfy the ratio (molar ratio) of each metal element in the composition represented by the following general formula (1), and the compounds are mixed by a mixing method such as ball milling to obtain a mixed slurry. Typical examples of the compound of each metal element include $Li_2CO_3$, $C_4H_5O_6Na \cdot H_2O$, $C_4H_5O_6K$, $Nb_2O_5$, and $Ta_2O_5$. Subsequently, the resultant mixed slurry can be dried by using a drier or by performing an operation such as filtering to obtain a mixed material. The resultant mixed material can be calcined, and ground if necessary to obtain the piezoelectric/electrostrictive porcelain composition having a desired particle diameter. It is to be noted that the calcining may be performed at a temperature of 750 to 1300° C. The grinding may be performed by a method such as ball milling.

$$A_1(Nb_xTa_y)O_{3-\delta} \tag{1},$$

wherein A denotes at least one alkali metal element selected from the group consisting of Li, Na, and K, and $0.7 \leq (x+y) < 1.0$.

An average particle diameter of the piezoelectric/electrostrictive porcelain composition is preferably 0.07 to 1 µm, more preferably 0.1 to 0.7 µm. It is to be noted that the particle diameter may be adjusted by performing a thermal treatment of powder of the piezoelectric/electrostrictive porcelain composition at 400 to 750° C. In this case, finer particles are formed integrally with the other particles to constitute the powder having a uniform particle diameter, and it is preferably possible to form the piezoelectric/electrostrictive article having the uniform particle diameter. The piezoelectric/electrostrictive porcelain composition may be prepared by an alkoxide process, a coprecipitation process or the like.

Next, one embodiment of a method of manufacturing the piezoelectric/electrostrictive device of the present invention will be described in accordance with an example in which shapes of the piezoelectric/electrostrictive article and the electrode are film-like shapes, and the device is provided with a substrate made of a ceramic (piezoelectric/electrostrictive film type device). First, a layer constituted of the piezoelectric/electrostrictive porcelain composition is formed on the substrate made of the ceramic or on the electrode formed on the surface of the substrate. Examples of a method of forming the electrode include ion beam, sputtering, vacuum evaporation, PVD, ion plating, CVD, plating, aerosol deposition, screen printing, spraying, and dipping. Above all, the sputtering method or the screen printing method is preferable in respect of a securing property to the substrate and the piezoelectric/electrostrictive article. As to the formed electrode, an appropriate temperature is selected depending on the material or forming method of the electrode, and the electrode can be formed integrally with the substrate and/or the piezoelectric/electrostrictive article by performing the thermal treatment at about 500 to 1400° C. This thermal treatment may be performed every time the electrode is formed, or may be performed together with the firing of the layer constituted of the piezoelectric/electrostrictive porcelain composition. However, after forming the layer constituted of the piezoelectric/electrostrictive porcelain composition, the thermal treatment is not performed at a temperature which exceeds the firing temperature of the layer constituted of the piezoelectric/electrostrictive porcelain composition.

Examples of a method of forming the layer constituted of the piezoelectric/electrostrictive porcelain composition on the substrate include ion beam, sputtering, vacuum evaporation, PVD, ion plating, CVD, plating, sol-gel, aerosol deposition, screen printing, spraying, and dipping. Above all, the screen printing method is preferable because the layer can be easily continuously formed into a highly precise shape and thickness. It is to be noted that to prepare the piezoelectric/electrostrictive film type device in which a plurality of piezoelectric/electrostrictive articles and electrodes are alternately sandwiched and layered, the electrode is formed on the layer formed on the substrate and constituted of the piezoelectric/electrostrictive porcelain composition by a method similar to the above-described method. It is to be noted that layers constituted of the piezoelectric/electrostrictive porcelain compositions, and electrodes are alternately and repeatedly formed on the electrode until a desired multilayered structure is obtained.

Thereafter, a layer obtained by alternately layering the layers constituted of the piezoelectric/electrostrictive porcelain compositions, and the electrodes on the substrate is integrally fired. According to the firing, the film-like piezoelectric/electrostrictive article can be secured to the substrate directly or via the film-like electrode. It is to be noted that the firing does not have to be integrally performed, and may be successively performed every time one layer constituted of the piezoelectric/electrostrictive porcelain composition is formed, but it is preferable to integrally fire the layer including the electrode from a viewpoint of production efficiency.

In this case, the firing temperature is preferably 800 to 1250° C., more preferably 900 to 1200° C. When the temperature is less than 800° C., the substrate or the electrode is incompletely secured to the piezoelectric/electrostrictive article, or denseness of the piezoelectric/electrostrictive article sometimes becomes insufficient. On the other hand, when the temperature exceeds 1250° C., the piezoelectric/electrostrictive characteristics of the resultant piezoelectric/electrostrictive article sometimes degrade. A maximum temperature retaining time during the firing is preferably one minute or more and ten hours or less, more preferably five minutes or more and four hours or less. When the maximum temperature retaining time is less than one minute, the piezoelectric/electrostrictive article is insufficiently densified, and desired characteristics are not obtained in some case. When the maximum temperature retaining time exceeds ten hours, there sometimes occurs a disadvantage that the piezoelectric/electrostrictive characteristics degrade.

Thereafter, a polarization treatment is performed on appropriate conditions. The polarization treatment is preferably performed by heating as in a known method. A heating temperature depends on Curie point of piezoelectric/electrostrictive porcelain, and is preferably set at 40 to 200° C.

Moreover, to form the whole piezoelectric/electrostrictive article into a sheet-like shape, after adding a plasticizer, a dispersant, a solvent or the like to the piezoelectric/electrostrictive porcelain composition to form the composition into a slurry using a general mixing device such as a ball mill, the slurry is formed into the sheet-like shape by use of a general sheet forming machine such as a doctor blade.

Furthermore, a conductive film (film containing a conductive material as a main component) constituting the electrode is formed in a predetermined pattern on the surface of the piezoelectric/electrostrictive article formed into the sheet-like shape by a technology such as screen printing. Thereafter, the layers constituted of the piezoelectric/electrostrictive porcelain composition, and the electrodes are alternately layered and attached under pressure, so that a ceramic green layer having a predetermined thickness can be obtained. In this case, a cell structure may be formed by layering sheets punched by use of a punch or a die. When the resultant ceramic green layer is integrally fired, the fired layer can be obtained. It is to be noted that when the cell structure is formed, a cell driving type piezoelectric/electrostrictive device can be obtained. It is to be noted that the firing does not have to be integrally performed, but the firing may be successively performed every time one layer constituted of the piezoelectric/electrostrictive porcelain composition is formed, but it is preferable to integrally fire the composition including the electrodes from a viewpoint of production efficiency.

EXAMPLES

The present invention will be specifically described hereinafter based on examples, but the present invention is not limited to these examples. There will be described methods of measuring various physical values.

[Bulk Density and Apparent Density]: Densities were measured with respect to a fired article (piezoelectric/electrostrictive article) by Archimedes method.

[Electric Field Induced Distortion]: A distortion gauge was attached onto the electrode, and an amount of the distortion in a direction vertical to the electric field was measured as the electric field induced distortion (ppm) in a case where a voltage of 4 kV/mm was applied.

Example 1

There were weighed $Li_2CO_3$, $C_4H_5O_6Na\cdot H_2O$, $C_4H_5O_6K$, $Nb_2O_5$, and $Ta_2O_5$ in such a manner that a ratio (molar ratio) of each metal element indicated a composition ratio shown in Table 1, and the elements were mixed in alcohol for 16 hours to prepare a mixture. After the resultant mixture was calcined at 750° C. for five hours, the mixture was ground using a ball mill to prepare a piezoelectric/electrostrictive porcelain composition. The powder was compacted and formed into a size of a diameter 20 mm×thickness 6 mm under a pressure of 2 t/cm² by use of the resultant piezoelectric/electrostrictive porcelain composition to obtain a green compact. The resultant green compact was stored in an alumina container, and fired at 1000° C. for three hours to obtain a fired article (piezoelectric/electrostrictive article). The resultant fired article was worked into a size of 12 mm×3 mm×1 mm, opposite surfaces of the article were coated with a silver paste to bake an electrode. The article was immersed into silicon oil at 70° C., a direct-current voltage of 5 kV/mm was applied between the electrodes for 15 minutes to perform polarization, and a piezoelectric/electrostrictive device (Example 1) was obtained. Various physical values of the resultant piezoelectric/electrostrictive device are shown in Table 1.

Examples 2 to 5, Comparative Examples 1 to 3

Each piezoelectric/electrostrictive device (Examples 2 to 5, Comparative Examples 1 to 3) was obtained in the same manner as in the above Example 1 except that $Li_2CO_3$, $C_4H_5O_6Na\cdot H_2O$, $C_4H_5O_6K$, $Nb_2O_5$, and $Ta_2O_5$ were weighed in such a manner that a ratio (molar ratio) of each metal element indicated a composition ratio shown in Table 1. Various physical values of the resultant piezoelectric/electrostrictive device are shown in Table 1.

Examples 6 and 7

Each piezoelectric/electrostrictive device (Examples 6 and 7) was obtained in the same manner as in the above Example 1 except that $Li_2CO_3$, $C_4H_5O_6Na\cdot H_2O$, $C_4H_5O_6K$, $Nb_2O_5$, $Sb_2O_3$, and $Ta_2O_5$ were weighed in such a manner that a ratio (molar ratio) of each metal element indicated a composition ratio shown in Table 1. Various physical values of the resultant piezoelectric/electrostrictive device are shown in Table 1.

It is apparent from the results shown in Table 1 that each of piezoelectric/electrostrictive devices of Examples 1 to 7 is denser and has a larger value of electric field induced distortion as compared with each of the piezoelectric/electrostrictive devices of Comparative Examples 1 to 3. It is also apparent that each of piezoelectric/electrostrictive devices of Examples 6 and 7, each using a piezoelectric/electrostrictive porcelain composition containing Sb in the B site, has a larger value of electric field induced distortion as compared with each of the piezoelectric/electrostrictive devices of Examples 1 to 5, which are manufactured using a piezoelectric/electrostrictive porcelain composition without Sb in the B site.

INDUSTRIAL APPLICABILITY

It is possible to obtain a piezoelectric/electrostrictive device which is dense and superior in crystallinity and which exhibits superior piezoelectric/electrostrictive characteristics even in a case where a piezoelectric/electrostrictive porcelain composition of the present invention is fired on lower-temperature conditions as compared with a conventional technology. Therefore, the piezoelectric/electrostrictive device of the present invention prepared using this piezoelectric/electrostrictive porcelain composition has superior piezoelectric/electrostrictive characteristics, and is suitable for an actuator, a sensor or the like.

What is claimed is:

1. A piezoelectric/electrostrictive device comprising:
a piezoelectric/electrostrictive article obtained by firing a piezoelectric/electrostrictive porcelain composition consisting of Nb, Ta, and one or more alkali metal elements,
wherein a molar ratio of Nb, Ta, and the alkali metal element in the fired piezoelectric/electrorestrictive porcelain composition is represented by a non-stoichiometric composition ratio, and
wherein the piezoelectric/electrostrictive porcelain composition is obtained by mixing compounds including metal elements in a composition represented by the following general formula (1) so as to satisfy a molar ratio of the metal elements in the composition, thereby obtaining a mixture, and then calcining the resultant mixture:

$$A_1(Nb_xTa_y)O_{3-\delta} \qquad (1),$$

wherein A denotes at least one alkali metal element selected from the group consisting of Li, Na and K, and

TABLE 1

| | Composition ratio | Bulk density (g/cm³) | Apparent density (g/cm³) | Electric field induced distortion (ppm) |
|---|---|---|---|---|
| Example 1 | $(Li_{0.05}Na_{0.475}K_{0.475})(Nb_{0.90}Ta_{0.08})O_{3-\delta}$ | 4.35 | 4.37 | 793 |
| Example 2 | $(Li_{0.06}Na_{0.47}K_{0.47})(Nb_{0.90}Ta_{0.08})O_{3-\delta}$ | 4.46 | 4.47 | 870 |
| Example 3 | $(Li_{0.07}Na_{0.48}K_{0.45})(Nb_{0.90}Ta_{0.08})O_{3-\delta}$ | 4.44 | 4.45 | 770 |
| Example 4 | $(Li_{0.07}Na_{0.54}K_{0.39})(Nb_{0.91}Ta_{0.08})O_{3-\delta}$ | 4.37 | 4.38 | 560 |
| Example 5 | $(Li_{0.06}Na_{0.58}K_{0.36})(Nb_{0.93}Ta_{0.8})O_{3-\delta}$ | 4.42 | 4.43 | 630 |
| Comp. Ex. 1 | $(Li_{0.05}Na_{0.475}K_{0.475})(Nb_{0.90}Ta_{0.10})O_3$ | 4.41 | 4.57 | 504 |
| Comp. Ex. 2 | $(Li_{0.07}Na_{0.68}K_{0.25})(Nb_{0.90}Ta_{0.10})O_3$ | 4.30 | 4.31 | 280 |
| Comp. Ex. 3 | $(Li_{0.07}Na_{0.58}K_{0.35})(Nb_{0.92}Ta_{0.08})O_3$ | 4.30 | 4.32 | 370 |
| Example 6 | $(Li_{0.06}Na_{0.575}K_{0.375})(Nb_{0.84}Ta_{0.1}Sb_{0.04})O_{3-\delta}$ | 4.43 | 4.44 | 1050 |
| Example 7 | $(Li_{0.06}Na_{0.49}K_{0.45})(Nb_{0.84}Ta_{0.1}Sb_{0.04})O_{3-\delta}$ | 4.43 | 4.44 | 900 |

$0.7 \leq (x+y) \leq 0.995$; and an electrode electrically connected to the piezoelectric/electrostrictive article.

2. The piezoelectric/electrostrictive device according to claim 1, wherein A in the general formula (1) is represented by the following general formula (2), and ranges of x and y are $0<x<1$ and $0<y<1$, respectively:

$$Li_a Na_b K_c \qquad (2);$$

wherein $0<a \leq 0.5, 0 \leq b \leq 1$, and $0 \leq c \leq 1$.

3. The piezoelectric/electrostrictive device according to claim 1 wherein the piezoelectric/electrostrictive article and the electrode each have film-like shapes;

wherein the piezoelectric/electrostrictive device further comprises a ceramic substrate; and wherein the piezoelectric/electrostrictive article is secured to the ceramic substrate directly or via the electrode.

* * * * *

UNITED STATES PATENT AND TRADEMARK OFFICE
CERTIFICATE OF CORRECTION

PATENT NO. : 7,576,477 B2
APPLICATION NO. : 11/370213
DATED : August 18, 2009
INVENTOR(S) : Takaaki Koizumi, Hirofumi Yamaguchi and Ritsu Tanaka It is certified that error appears in the above-identified patent and that said Letters Patent is hereby corrected as shown below:

Column 4
   Line 59: please delete "-" before "and"

Column 5
   Line 57: please change "materials" to --material--

Column 13
   Line 10 of Table 1: please change "Example 5 (Li $_{0.06}$Na$_{0.58}$K$_{0.36}$)(Nb$_{0.93}$Ta$_{0.8}$)O$_{3-\delta}$" to --Example 5 (Li$_{0.06}$Na$_{0.58}$K$_{0.36}$)(Nb$_{0.93}$Ta$_{0.08}$)O$_{3-\delta}$--

Column 14
   Line 36: please change "piezoelectric/electrorestrictive" to --piezoelectric/electrostrictive--

Signed and Sealed this

Tenth Day of November, 2009

David J. Kappos
*Director of the United States Patent and Trademark Office*